US006224935B1

(12) United States Patent
Diaz et al.

(10) Patent No.: US 6,224,935 B1
(45) Date of Patent: May 1, 2001

(54) ORDERED ARRAYS VIA METAL-INITIATED SELF-ASSEMBLY OF LIGAND CONTAINING DENDRIMERS AND BRIDGING LIGANDS

(75) Inventors: Diego Diaz, Ithaca, NY (US); Gregory D. Storrier, McKellar (AU); Kazutake Takada, Ithaca, NY (US); Stefan Bernhard, Ithaca, NY (US); Hector D. Abruna, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 09/488,927

(22) Filed: Jan. 21, 2000

Related U.S. Application Data
(60) Provisional application No. 60/117,644, filed on Jan. 28, 1999.

(51) Int. Cl.[7] ........................................ B05D 5/12
(52) U.S. Cl. ............................................ 427/58; 427/113
(58) Field of Search ......................... 427/113, 58

(56) References Cited

U.S. PATENT DOCUMENTS

| | | | |
|---|---|---|---|
| 4,507,466 | 3/1985 | Tomalia et al. | 528/332 |
| 4,558,120 | 12/1985 | Tomalia et al. | 528/363 |
| 5,041,516 | 8/1991 | Frechet et al. | 528/44 |
| 5,130,120 | 7/1992 | Weber | 424/9.364 |
| 5,137,711 | 8/1992 | Weber et al. | 424/9.365 |
| 5,154,853 | 10/1992 | Newkome et al. | 516/56 |
| 5,338,532 | 8/1994 | Tomalia et al. | 424/1.49 |
| 5,422,372 | 6/1995 | Newkome et al. | 521/53 |
| 5,530,092 | 6/1996 | Meijer et al. | 528/363 |
| 5,585,457 | 12/1996 | Newkome et al. | 528/353 |
| 5,610,268 | 3/1997 | Meijer et al. | 528/363 |
| 5,650,101 | 7/1997 | Newkome et al. | 264/4.3 |
| 5,714,166 | 2/1998 | Tomalia et al. | 424/486 |
| 5,723,219 | 3/1998 | Kolluri et al. | 428/411.1 |
| 5,759,518 | 6/1998 | Schmitt-Willich et al. | 424/9.36 |
| 5,760,163 | 6/1998 | Fisch et al. | 528/310 |

OTHER PUBLICATIONS

Constable, E. C., et al., J. Chem. Soc. Dalton Trans. 1992, 3467–3475.
Diaz, D. J., et al., "Electrochemical and SPM Studies of Redox Active Dendrimer Films on Electrodes," Poster Session Presented on 5/19 and May 20, 1998 at Cornell Polymer Outreach Program 9th Annual Symposium and Short Course.
Diaz, D. J., et al., Langmuir 15, 7351–7354 (1999).
Fife, W. K., J. Org. Chem., 48, 1375–1377 (1983).
Storrier, G. D., et al., Langmuir 15, 872–884 (1999).
Tsukruk, V. V., Adv. Mater. 10, No. 3, 253–257 (1998).
Diaz et al., "Electrochemical and SPM Studies of Redox Active Dendrimers Films on Electrodes".*

* cited by examiner

Primary Examiner—Brian K. Talbot

(57) ABSTRACT

An ordered film is formed on a surface by reacting (a) dendrimer or bridging ligand functionalized for reaction with transition metal ions (e.g., terpyridyl-pendant polyamido amine starburst dendrimers or 1,4-bis[4,4"-bis(1,1-dimethylethyl)-2,2':6'2" terpyridine-4'-yl]benzene), dissolved in water immiscible solvent, with (b) transition metal ions dissolved in water, on said surface. This method allows formation of films useful, for example, as electron transfer mediators, other electronic devices, catalysts, sensors, and electrochromic devices.

2 Claims, 4 Drawing Sheets

ORDERED ARRAYS VIA METAL-INITIATED SELF-ASSEMBLY OF LIGAND CONTAINING DENDRIMERS AND BRIDGING LIGANDS

CROSS-REFERENCE TO RELATED APPLICATION

This application claims the benefit of U.S. Provisional Application No. 60/117,644, filed Jan. 28, 1999.

This invention was made at least in part with United States Government support under Office of Naval Research Grant No. 000149411010. The United States Government has certain rights in the invention.

TECHNICAL FIELD

The invention here is directed to forming highly ordered films of metallo dendrimers and transition metal complexes of bridging ligands on surfaces.

BACKGROUND OF THE INVENTION

Films of dendrimers on surfaces have been prepared by a variety of methods including self-assembly, surface confinement and spin coating. See Tsukruk, V. V., Adv. Mater. 10, 253 (1998) and references therein. For example, films of dendrimers on surfaces have been prepared by self-assembly by absorbing dendrimers with amine end-groups on various surfaces such as gold surfaces. These preparations by others have not allowed obtaining films that are sufficiently ordered so that one can obtain molecularly-resolved images of dendrimers on surfaces, so formation of dendrimer films of deliberate architecture has not heretofore been possible.

SUMMARY OF THE INVENTION

The method of the invention herein allows obtaining molecularly-resolved images of metallo dendrimers and transition metal complexes of bridging ligands on surfaces and enables forming film structures of deliberate architecture.

Said method is for forming an ordered film on a surface, i.e., on a substrate, and comprises interfacially reacting (a) dendrimer or bridging ligand functionalized for reaction with and binding to transition metal ions, dissolved in a water immiscible solvent, with (b) transition metal ions dissolved in water, on said surface.

In reactions that have been carried out, the dendrimer is poly-amido amine starburst dendrimer functionalized by pendant terpyridyl groups (8 or 32 terpyridine substituents) or the bridging ligand is 1,4-bis[4,4"-bis(1,1-dimethylethyl)-2,2':6',2" terpyridine-4'-yl]benzene (BBDTB). The functionalized dendrimer or bridging ligand is dissolved in methylene chloride for (a). The transition metal ions for (b) are $Fe^{2+}$ or $Co^{2+}$ ions. The reactions were carried out on a highly ordered pyrrolytic graphite (hereinafter sometimes denoted HOPG) surface.

The term "interfacially reacting" is used herein to mean reacting at the solvent water interface. The interfacial nature of the reaction limits the reaction to two dimensions and thus enhances film formation.

The term "dendrimer" is used herein to refer to a highly branched molecule that is made in a stepwise synthesis that allows control of size and weight.

The term "bridging ligand" is used herein to refer to a molecule that has two (or more) sites, on different sides of such molecule that can bind metal centers.

DETAILED DESCRIPTION

Figure 1A:
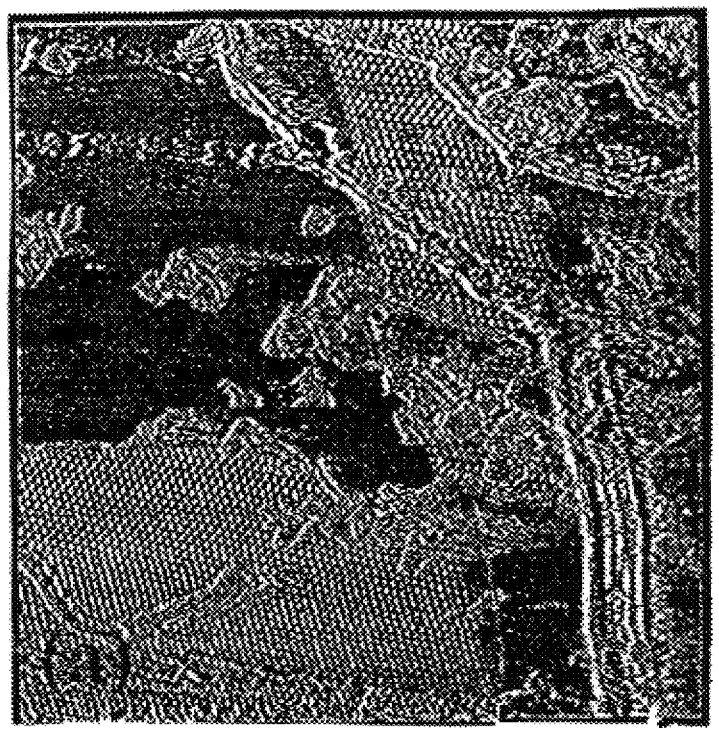
FIG. 1(a) is a 550×550 nm STM image obtained in Example I hereinafter and shows large parts of the substrate covered with a well organized dendrimer film.
Figure 1B:
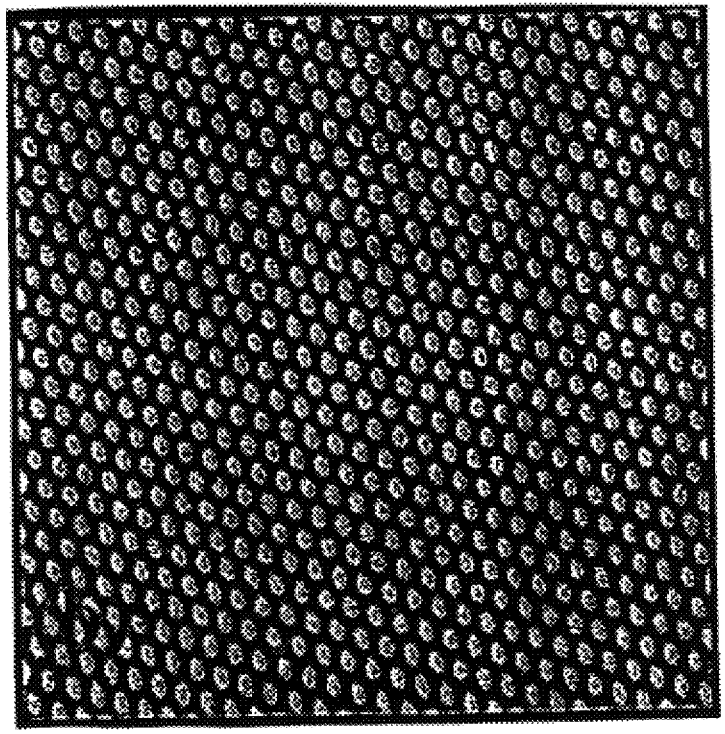
FIG. 1(b) is a 200×200 nm STM image, i.e., a close-up, of part of the organized region shown in FIG. 1(a) and shows a highly-ordered two-dimensional hexagonal domain.
Figure 1C:
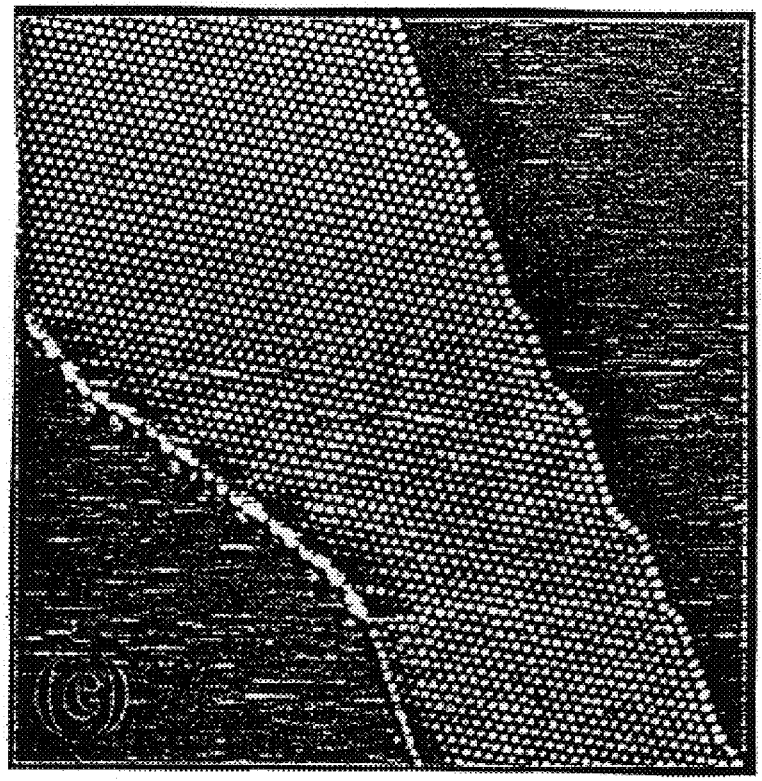
FIG. 1(c) is a 304×304 nm STM image obtained in Example I hereinafter, showing the step edges of the coated substrate and shows that the highly ordered domain is delimited by the step edges, i.e., the terrace dimensions.
Figure 1D:
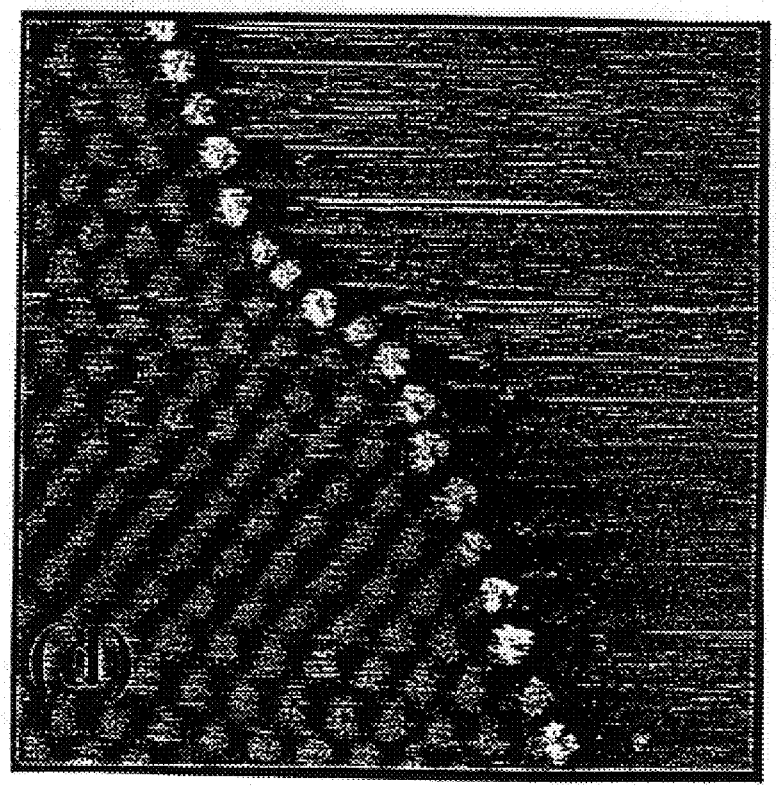
FIG. 1(d) is a 69×69 nm STM image, i.e., a close-up, of the dendrimer film obtained in Example I hereinafter, along a step edge.

The dendrimers that are to be functionalized for use in the method herein can be purchased commercially and preferably are characterized by amine end-groups. An exemplary dendrimer that is to be functionalized is a poly-amido amine starburst dendrimer; such dendrimer has amine end-groups (e.g., 4, 8, 16, 32 or 64 amine end-groups) which can be further functionalized by a variety of synthetic methodologies. Such dendrimer can be purchased from Aldrich Chemical Co. (St. Louis, Mo.) as a 20 weight percent solution in methanol.

Functionalization of the dendrimer for reaction with and binding to transition metal ions can be carried out by forming a dendrimer ligand such that the formation constant of transition metal ions with the ligand, is large and the kinetics of binding are rapid. The metal binding site (functionalization) within the dendrimer is preferably located on the periphery of the molecule. Terpyridyl-pendant dendrimers have been found to provide rapid kinetics for complex formation when $Fe^{2+}$ or $Co^{2+}$ is the transition metal. Terpyridine substituents (e.g., 4, 8, 16, 32 or 64 of 2,2':6',2" terpyridine substituents per dendrimer molecule) can be formed through the peptide coupling of a carboxylic acid-pendant 2,2':6',2" terpyridine ligand with poly-amido amine starburst dendrimer. This reaction can be carried out by stirring 4'-(3-carboxypropyl)-2,2':6',2"-(terpyridine), N,N'-dicyclohexylcarbodiimide, 1-hydroxybenzotriazole and the dendrimer in N,N-dimethylacetamide at room temperature. The number of terpyridine substituents can be varied by using poly-amido amine starburst dendrimers containing different numbers of reactive groups, in the formation of the terpyridyl-pendant dendrimers. The synthesis of terpyridyl-pendant dendrimers is described in more detail in a manuscript titled "Synthesis, Characterization, Electrochemistry and EQCM Studies of Polyamidoamine Dendrimers Surface-Functionalized with Polypyridyl Metal Complexes" by G. D. Stonier, K. Takada and H. D. Abruna, cited as Langmuir 15, 872–884 (1999) which is incorporated herein by reference. The term "dend-8-tpy" is used herein to refer to the terpyridine functionalized poly-amido amine starburst dendrimer with 8 terpyridine substituents and the term "dend-32-tpy" is used herein to refer to the terpyridine functionalized poly-amido amine starburst dendrimer with 32 terpyridine substituents. A molecular structure for dend-8-tpy is set forth below:

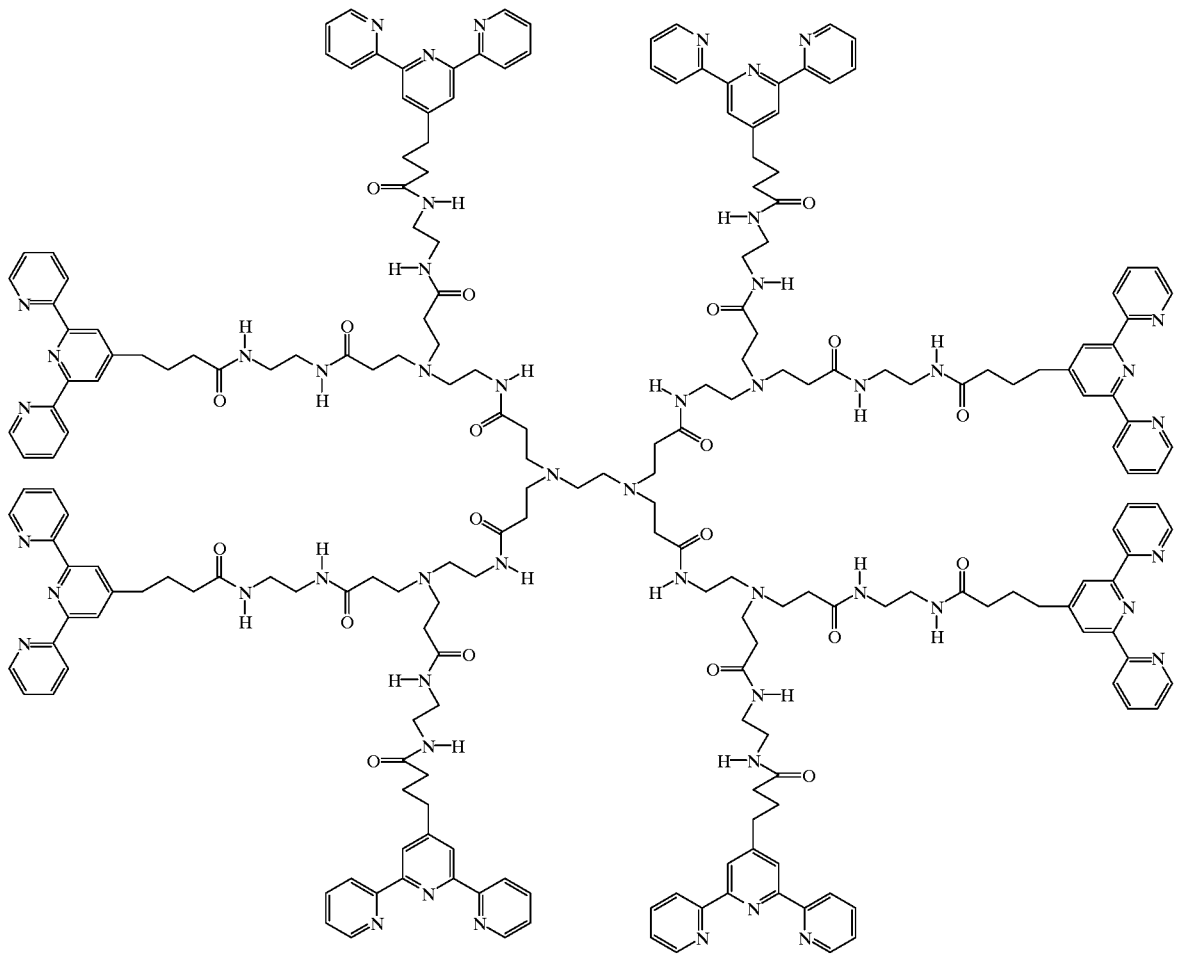

Other functionalizing substituents include, for example, pyridine, bipyridine and other polypyridyl, phenanthroline and amino substituents as well as alkyl or hydroxy substituted derivatives of these.

The functionalized bridging ligands include, for example, derivatives of 2-, 2"-, 3-, 3"-, 4-, 4"-, 5-, and 5"-substituted aryl bridged 2,2':6',2"-terpyridines such as 1,4-bis[4,4"-bis(1,1-dimethylethyl)-2,2':6',2" terpyridine-4'-yl]benzene (BBDTB) and 4,4'-bis[4,4"-bis(1,1-dimethylethyl)-2,2':6',2" terpyridine-4'-yl]biphenyl (BBDTBP) and derivatives of 2, 4, 6, and 4'alkylsubstituted 2,2':6',2"-terpyridines bridged with alkyl and aryl units such as p-xylene-bridged bis-dipineno-[4,5:4",5"]-fused 2,2':6',2"-terpyridine.

The BBDTB ligand, and related molecules, can be synthesized using published procedures for the synthesis of similar molecules. Constable, E. C., et al., J. Chem Soc. Dalton Trans, 1992, 3467–3475 and Fife, W. K., J. Org. Chem. 48, 1375–1377 (1983) provide the types of procedures employed in the synthesis of BBDTB.

We turn now to the water-immiscible solvent. For the functionalized dendrimer, the water-miscible solvent should be one in which the functionalized dendrimer is soluble. For the terpyridine functionalized dendrimers described above, methylene chloride is a preferred water-immiscible solvent and other useful water-immiscible solvents include, for example, trichloroethylene and halogenated hydrocarbons in general, diethyl ether and ethers in general. For other functionalized dendrimers and functionalized bridging ligands, appropriate water-immiscible solvents include the same solvents as those described for terpyridine functionalized dendrimers. Although extensive concentration dependence studies have not been carried out, we have typically employed concentrations in the micromolar range, e.g., 0.5 to 30 micromolar concentrations.

The transition metal ion should be selected to have a large value of the formation constant with the ligand of the functionalized dendrimer or functionalized bridging ligand and have rapid kinetics for complex formation with said ligand. Transition metal ions include ions of Sc, Ti, V, Cr, Mn, Fe, Co, Ni, Cu, Zn, Ru and Os. Where terpyridine substituent is functionalizing the dendrimer, $Fe^{2+}$ or $Co^{2+}$ ions, e.g., supplied by $FeSO_4$ and $CoSO_4$, respectively, are the preferred transition metal ions as the formation of $[Fe(terpyridine)_2]^{2+}$ and $[Co(terpyridine)_2]^{2+}$ have rapid kinetics and their formation constants are of the order of $10^{20}$, thus fulfilling the above-mentioned criteria. Metal ions or transition metal complexes preferred for other functionalizing substituents are, for example, $[Fe(CN)_5(NH_3)]^{-2}$, polypyridine complexes of Ru, such as $[Ru(bpy)_2LS]^{+n}$ (where bpy is 2,2'-bipyridine and 1,10 phenanthroline or diimine containing ligands, where L is any monodentate ligand or a weakly bound solvent molecule such as acetone or dimethoxyethane and S is a weakly bound solvent molecule such as acetone or dimethoxyethane and n is 1 or 2), for pyridine as a functionalizing substituent; $[Ru(bpy)_2 S_2]^{+2}$ (where bpy is 2,2'-bipyridine and 1,10 phenanthroline or diimine containing ligands, where S is a weakly bound solvent molecule such as acetone or dimethoxyethane), for bipyridine as a functionalizing substituent.

We turn now to the substrate providing the surface on which the ordered film is formed in the invention herein. A substrate that has been used, e.g., in slab form or in electrode form, is highly ordered pyrrolytic graphite (e.g., ZYA Grade from Union Carbide). Other substrate materials include, for example, any reasonably flat (with mean roughness less than a nanometer) surface including metal films, metal single crystals and layered materials such as $WS_2$, $WSe_2$, $MoS_2$, $MoSe_2$ and transition metal dichalcogenides, and mica.

The extent of the ordered domains formed depends on the surface characteristics of the substrate and in the case of HOPG is delimited by terrace width on the substrate and end at step edges on the substrate.

The method herein operates via metal-initiated self-assembly. This means that the metal center (e.g., Fe $^{+2}$) initiates the formation of highly ordered interfacial structures by binding to (in the case of terpyridine-containing dendrimers) two different dendrimer molecules and that by the repetition of such a process, highly ordered structures are formed.

The well ordered arrays of dendrimers formed herein by interfacially reacting dend-8-tpy and dend-32-tpy with $Fe^{2+}$ on HOPG substrate provided well organized domains that are redox active dendrimer films which exhibit hexagonal or square packing. The film coated substrates obtained can be used, for example, as electrodes for electrocatalysis, electrosynthesis, electroanalysis, sensors, photo-electrochemistry, electrochromic devices, and electronic devices.

The method herein is adaptable, for example, for providing electron transfer mediators (e.g., for semiconductors), other electronic devices, catalysts, sensors, and electrochromic devices.

The method herein allows control of surface structure, for example, for semiconductors or catalysts.

Elements of the invention are disclosed in a publication which is titled "Ordered Arrays Generated via Metal-Initiated Self-Assembly of Terpyridine Containing Dendrimers and Bridging Ligands," cited as Diaz, D. J., et al. Langmuir 15, 7351–7354 (1999) which is incorporated herein by reference, and in a Poster Session presented on May 19, 1998 titled "Electrochemical and SPM Studies of Redox Active Dendrimer Films on Electrodes", a copy of an associated abstract forming part of and being attached to related Provisional Application No. 60/117,644 which is incorporated herein by reference.

As indicated above, this application claims the benefit of U.S. Provisional Application No. 60/117,644. The entire disclosure of U. S. Provisional Application No. 60/117,644 is incorporated herein by reference.

The invention is illustrated by the following working examples.

EXAMPLE I

Dend-8-tpy was prepared as follows: A molar excess of the carboxylic acid-pendant pyridyl ligand (either iso-nicotine acid, 4-(3-carboxypropyl)-4'-methyl-2,2'-bipyridine or 4'-(3-carboxypropyl)-2,2':6',2"-terpyridine), N,N'-dicyclohexylcarbodiimide (DCC) and 1-hydroxybenzotriazole (HOBt) were dissolved in N,N-dimethylacetamide. The poly-amido amine starburst dendrimer described above with eight amine end-groups (20% wt solution in methanol) was added and the solution stirred at room temperature until completeness was obtained. The reaction mixture was filtered to remove precipitated N,N'-dicyclohexylurea and the filtrate added dropwise to diethyl ether (400 ml). The solid was filtered and washed well with diethyl ether and acetone. The solid was then dissolved in methanol and anion exchange resin was added and the flask swirled. The resin was removed by filtration, the filtrate concentrated in vacuo and the solution purified by repeated gel permeation chromatography using $CH_2Cl_2/CH_3OH$(5:1) as eluent. The dendrimer was collected, concentrated and then added dropwise to diethyl ether, filtered and dried in vacuo, to obtain dend-8-tpy.

A 0.02 mM solution of dend-8-tpy in methylene chloride was brought in contact with aqueous $FeSO_4$ (0.1 M) on a freshly cleaved HOPG substrate (ZYA Grade, Union Carbide). The reaction was allowed to proceed at room temperature for 18 hours. The surface was then washed with water and methylene chloride to remove excess reactants. The result was the formation of a film of complex of dend-8-tpy and $Fe^{2+}$, denoted dend-8-tpy/$Fe^{2+}$, on HOPG.

Samples of dend-8-tpy/$Fe^{2+}$ on HOPG were studied by scanning tunneling microscopy (STM), a type of scanned probe microscopy (SPM), operating in air using a Molecular Imaging 10 $\mu$m Scanner, Molecular Imaging Isolation Chamber and Digital Instruments Nanoscope E Controller. All images were unfiltered and taken on-line. No off-line zoom was used. A bias between +140 and 200 mV was applied and a setpoint current between 1.5 to 2.0 nA was used. The scan rates were between 4 Hz for larger scale images and 15 Hz for smaller size images. The images were taken at 512 samples resolution to obtain better detailed images.

Images obtained are depicted in FIGS. 1(*a*), 1(*b*), 1(*c*), 1(*d*), 2(*b*) and 2(*d*).

For FIG. 1(*a*), the imaging conditions (scanning mode, bias, setpoint current) were constant height, 200 mV, 1.70 nA. FIG. 1(*a*) shows a 550×550 nm image of dend-8-tpy/$Fe^{2+}$ where large parts of the HOPG substrate are covered by a well organized dendrimer film. In contrast, images of dend-8-tpy in the absence of a metal carrier, adsorbed an HOPG substrate (by evaporation of a 0.02 mM methylene chloride solution) exhibited only large irregular clusters which were easily dragged by the electrochemically etched Pt/Ir tip of the imaging scanner so that no stable image could be obtained independent of changes in imaging conditions.

For FIG. 1(*b*), the imaging conditions (scanning mode, bias, setpoint current) were constant current, 150 mV, 1.70 nA. FIG. 1(*b*) is a 200×200 nm image which is a close-up of part of the ordered regions apparent in FIG. 1(*a*) and illustrates the hexagonal packing of the dendrimer complex on the HOPG surface.

For FIG. 1(*c*), the imaging conditions (scanning mode, bias, setpoint current) were constant height, 146 mV, 1.5 nA. FIG. 1(*c*) is a 304×304 nm image and shows that the highly-ordered domain is delimited by the terrace dimensions where a terrace is an area of the surface that is atomically smooth and is delimited by a surface imperfection or discontinuity such as a step.

For FIG. 1(*d*), the imaging conditions (scanning mode, bias, setpoint current) were constant height, 199 mV, 1.5 nA. FIG. 1(*d*) is a 69×69 nm image, i.e., a close-up, of the step edge delimiting a terrace and shows that the step edge is followed by what appears to be a one-dimensional array of the complex (akin to a string of pearls) and suggests that the highly-ordered regions within the terraces are likely the result of two-dimensional packing of one-dimensional strands where the repeat unit would ostensibly be (tpy-dend- (tpy')$_6$-tpy-Fe$^{2+}$)$_x$ where tpy is coordinated terpyridine, tpy' is non-coordinated terpyridine and dend is dendrimer.

Figure 2A:
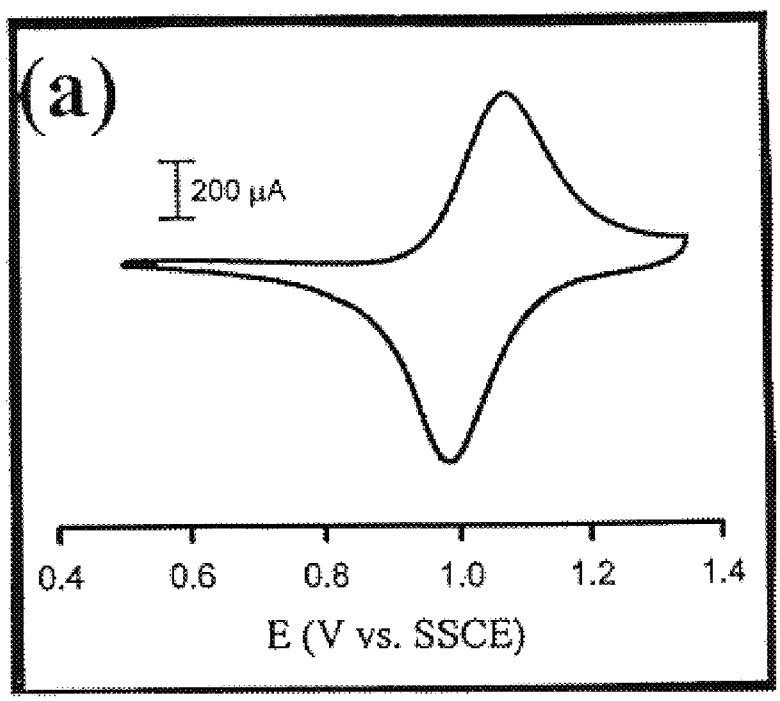
FIG. 2(a) is a cyclic voltammogram of a dendrimer-modified HOPG electrode and shows results of Example II hereinafter.
Figure 2B:
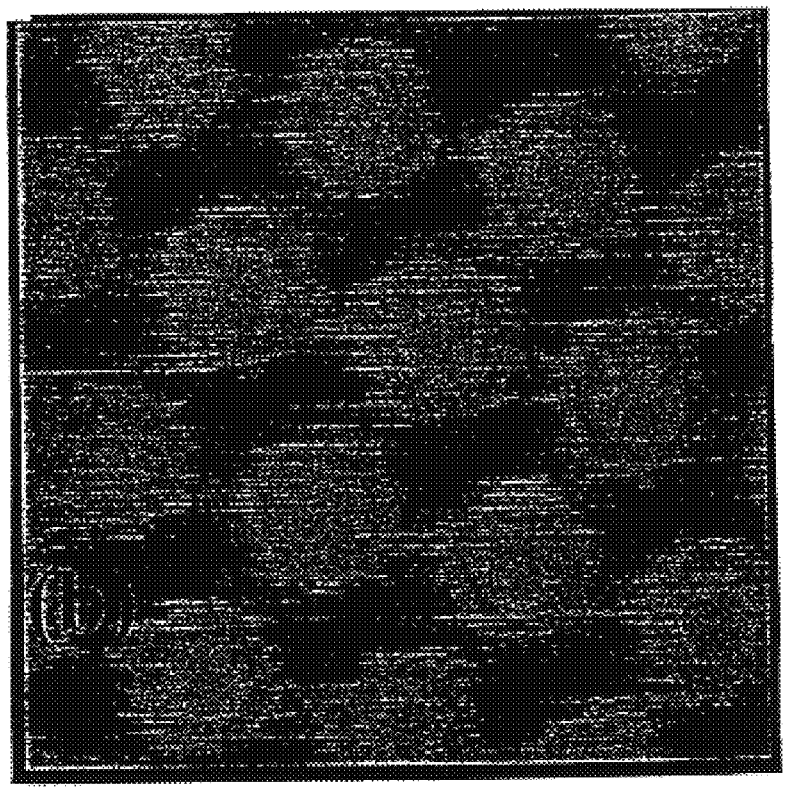
FIG. 2(b) is a high resolution STM image (26×26 nm, unfiltered) of the film obtained in Example I hereinafter.

For FIG. 2(b), the imaging conditions (scanning mode, bias, setpoint current) are constant current, 150 mV, 1.70 nA. FIG. 2(b) is a high resolution STM image (26×26 nm) and clearly shows the hexagonal packing of the highly ordered region.

Figure 2C:
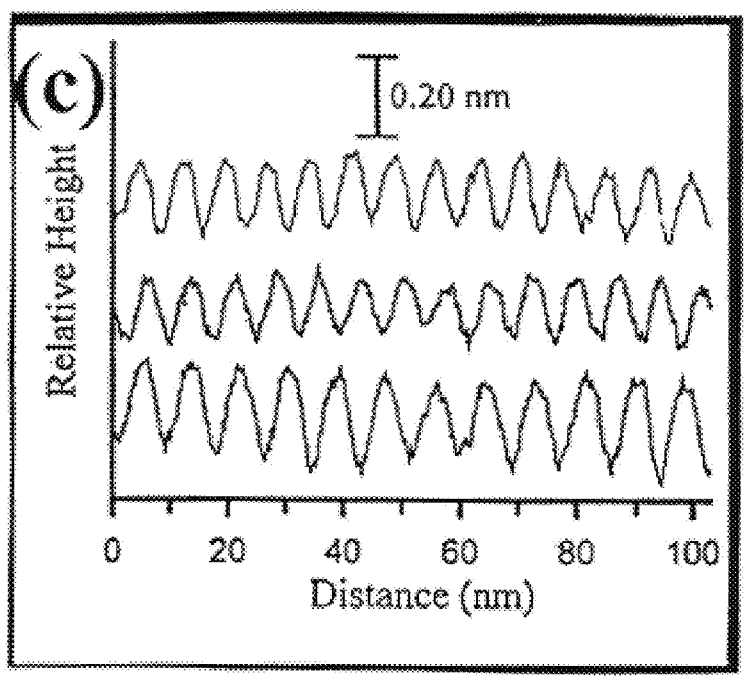
FIG. 2(c) depicts section analyses of the film in alignments depicted in FIG. 2(d).
Figure 2D:
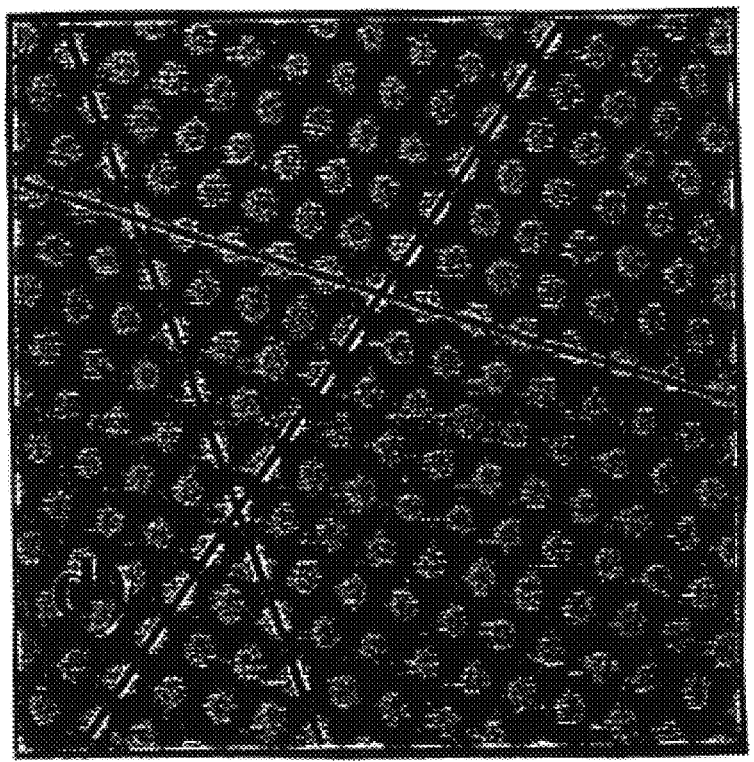
FIG. 2(d) is a 105×105 STM image of the film obtained in Example I hereinafter, illustrating the alignments of the section analysis of FIG. 2(c).

For FIG. 2(d), the imaging conditions (scanning mode, bias, setpoint current) are constant current, 150 mV, 170 nA. FIG. 2(d) is a 105×105 image illustrating the alignments of section analyses of FIG. 2(c).

FIG. 2(c) depicts section analyses of dendrimer film in the alignments depicted in FIG. 2(d) and shows that in the hexagonal arrays the intermolecular distances are equivalent along two directions but longer along the third. This difference is consistent with two-dimensional packing of one-dimensional strands.

The STM images of the dendrimer films are very stable and can be repeatedly imaged with virtually no degradation of image quality. This is in contrast to most, if not all, reports of images of dendrimers on surfaces. See Sheiko, S. S., Macromol. Rapid Commun. 17, 283 (1996). This reproducibility suggests that there are strong intermolecular interactions and that these could likely be responsible for the stability of the ordered domains. This stability allowed the obtaining of the very high resolution images described above. The high resolution is obtained even with unfiltered images.

The size values for the dendrimers obtained from the STM images are in the range of 5 to 6 nm This is in good agreement with values obtained by calculations (using the modeling program HYPERChem) which suggest a size of approximately 5 nm.

Similarly ordered films were obtained when substituting CoSO$_4$(0.1 M) for the FeSO$_4$.

EXAMPLE II

Coating of a substrate with a film of highly ordered dendrimer is carried out the same as in Example I except that the substrate is an HOPG electrode.

FIG. 2(a) is a cyclic voltammogram at 50 mV/s, in acetonitrile/0.1M tetra-n-butyl ammonium perchlorate, of the dendrimer modified HOPG electrode and shows that the films are electrochemically active and exhibit a well-defined reversible redox couple with an E$^{0'}$ value (formal potential) of +1.03 V vs. SSCE (saturated sodium calomel electrode), a value very close to that reported for [Fe(tpy)$_2$]$^{2+}$ of E$^{0'}$=1.10 V vs. SSCE (see Arana, C., et al., Inorg. Chem. 31, 3680 (1992)), i.e., consistent with the formation of bis (terpyridyl) iron (II) complexes.

EXAMPLE III

Coating of a substrate of a film of highly ordered dendrimer is carried out the same as in Example I except that the functionalized dendrimer was dend-32-tpy which was prepared the same as dend-8-tpy except that the starting material was poly-amido amine starburst dendrimer with 32 amine end-groups instead of poly-amido amine starburst dendrimer with eight amine end-groups. The resulting films exhibit a hexagonal packing. There was a higher tendency to form 3-dimensional structures attributed to the larger number of terpyridine groups oriented toward the interface.

EXAMPLE IV

Coating of a substrate with a highly ordered film of the bridging ligand BBDTB was carried out the same as the film forming in Example I except that the bridging ligand BBDTB was used instead of the functionalized dendrimer. The resulting films exhibited quasi-hexagonal packing.

Variations

Many variations of the above will be obvious to those skilled in the art. Thus, the invention is defined by the claims.

What is claimed is:

1. A method of forming an ordered film on a surface, said method comprising interfacially reacting (a) dendrimer or bridging ligand functionalized for reaction with transition metal ions, dissolved in water immiscible solvent with (b) transition metal ions dissolved in water, on said surface.

2. The method of claim 1, wherein the dendrimer or bridging ligand of (a) is a terpyridyl-pendant dendrimer and the transition metal ions are Fe$^{2+}$ ions.

* * * * *